United States Patent
Müller-Weinfurtner et al.

(10) Patent No.: US 11,533,126 B1
(45) Date of Patent: Dec. 20, 2022

(54) SOFT-OUTPUT VITERBI EQUALIZER FOR NON-BINARY MODULATION

(71) Applicant: Cisco Technology, Inc., San Jose, CA (US)

(72) Inventors: Stefan Helmut Müller-Weinfurtner, Nuremberg (DE); Andreas Bernhard Bisplinghoff, Forchheim (DE)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/407,764

(22) Filed: Aug. 20, 2021

(51) Int. Cl.
*H04L 1/00* (2006.01)
*H04L 25/03* (2006.01)
*H03M 13/41* (2006.01)

(52) U.S. Cl.
CPC .......... *H04L 1/0054* (2013.01); *H03M 13/41* (2013.01); *H04L 25/03318* (2013.01)

(58) Field of Classification Search
CPC ............ H04L 1/0054; H04L 25/03203; H04L 25/03248; H04L 25/03312; H04L 25/03318; H04L 2025/03318; H04L 27/06; H04L 27/38; H03M 13/41; H03M 13/4138; H03M 13/45; H03M 13/6331
See application file for complete search history.

(56) References Cited

U.S. PATENT DOCUMENTS

| | | | |
|---|---|---|---|
| 2006/0029166 A1* | 2/2006 | Kang | .................. H04L 25/0226 375/343 |
| 2006/0161834 A1 | 7/2006 | Satio et al. | |
| 2007/0220409 A1 | 9/2007 | Shao et al. | |
| 2012/0159288 A1 | 6/2012 | Kamuf et al. | |
| 2018/0321902 A1* | 11/2018 | Mamola | .................. G10L 19/00 |
| 2020/0021307 A1* | 1/2020 | Ionita | .................... H04L 1/0041 |

FOREIGN PATENT DOCUMENTS

CN          101119177 A1      2/2008

OTHER PUBLICATIONS

Ouyang, "A High Throughput Low Power Soft-Output Viterbi Decoder," https://www.diva-portal.org/, Mar. 2010, 80 pages.
Rha, et al., "Low-Complexity Soft-Decision Viterbi Algorithm for IM/DD 56-GB/s PAM-4 System," IEEE Photonics Technology Letters, vol. 31, No. 5, Mar. 1, 2019, 4 pages.

(Continued)

*Primary Examiner* — Betsy Deppe
(74) *Attorney, Agent, or Firm* — Edell, Shapiro & Finnan, LLC

(57) ABSTRACT

A method comprises: receiving, from a communication channel, non-binary multilevel symbols that represent corresponding multibit labels each including at least a least-significant bit (LSB) and a most-significant bit (MSB), the non-binary multilevel symbols mapped to the multibit labels according to set-partition labeling, which partitions the non-binary multilevel symbols between a first set and a second set according to a first value and a second value of the LSB, respectively; digitizing the non-binary multilevel symbols to produce symbol samples; and performing Soft-Output-Viterbi (SOV) equalization of the non-binary multilevel symbols based on the symbol samples, to produce decoded symbol information corresponding to the non-binary multilevel symbols.

20 Claims, 14 Drawing Sheets

(56) References Cited

OTHER PUBLICATIONS

Haratsch, et al., "A Radix-4 Soft-Output Viterbi Architecture," 2008 IEEE International Symposium on VLSI Design, Automation and Test (VLSI-DAT), Apr. 2008, 4 pages.
Nill, et al., "List and Soft Symbol Output Viterbi Algorithms: Extensions and Comparisons," IEEE Transactions on Communications, vol. 43, Issue: 2/3/4, Feb./Mar./Apr. 1995, 11 pages.
Berrou, et al., "A low complexity soft-output Viterbi decoder architecture," Proceedings of ICC '93—IEEE International Conference on Communications, May 1993, 4 pages.
Jung, et al., "VLSI Implementation of Soft Output Viterbi Equalizers for Mobile Radio Applications," [1992 Proceedings] Vehicular Technology Society 42nd VTS Conference—Frontiers of Technology, May 1992, 9 pages.
Hagenauer, et al., "A Viterbi Algorithm with Soft-Decision Outputs and its Applications," 1989 IEEE Global Telecommunications Conference and Exhibition 'Communications Technology for the 1990s and Beyond', Nov. 1989, 7 pages.
Daskalakis, et al., "4-PAM Modulation of Ambient FM Backscattering for Spectrally Efficient Low Power Applications," IEEE Transactions on Microwave Theory and Techniques, vol. 66, Issue: 12, Dec. 2018, 13 pages.
Battail, Ponderation des symboles decodes par l'algoriThme De Viterbi (Weighting the symbols decoded by the viterbi algorithm), Annales des Telecommunications vol. 42, pp. 31-38 (1987), Jan. 1987, 9 pages.

\* cited by examiner

| Delta Metric | Symbol difference (SyDelta) | Enumeration or Priority |
|---|---|---|
| $\delta_1$ | 1=0b01 (MSB same, LSB different) | A |
| $\delta_2$ | 2=0b10 (MSB different, LSB same) | C (possibly omitted!) |
| $\delta_3$ | 3=0b11 (MSB and LSB different) | B |

```
┌─────────────────────────────────────────────┐
│ In a multilevel trellis of possible outcomes,│
│ determine (i) an ML path associated with an ML symbol │ ─── 1122
│ that represents an ML multibit label, and (ii) competitor │
│ paths associated with competitor symbols that represent │
│ competitor multibit labels │
└─────────────────────────────────────────────┘
                      │
                      ▼
┌─────────────────────────────────────────────┐
│ Determine, among the competitor symbols, flipped-bit │
│ competitor symbols having LSBs that are flipped with │ ─── 1124
│ respect to an LSB of the ML symbol │
└─────────────────────────────────────────────┘
                      │
                      ▼
┌─────────────────────────────────────────────┐
│ Perform trace-back processing only on the │
│ competitor paths associated with the flipped-bit │ ─── 1126
│ competitor symbols, to update soft values for the LSBs │
│ that are flipped │
└─────────────────────────────────────────────┘
```

1132 Divide symbols/symbol samples into overlapping chunks that include leading overlap symbol samples from a previous overlapping chunk that was previously processed, middle symbol samples that were not previously processed, and trailing overlap symbol samples that were not previously processed and that are to be used as overlap symbol samples for a next overlapping chunk

1134 Process the overlapping chunks in sequence (see 1136-1140)

1136 Define a window of the symbol samples a particular overlapping chunk

1138 Incrementally slide a position of the window across the particular overlapping chunk, from the leading overlap symbol samples to the trailing overlap symbol samples

1140 Process the window of the symbol samples at each position (perform soft-value updates of LSBs)

FIG.11C

SOFT-OUTPUT VITERBI EQUALIZER FOR NON-BINARY MODULATION

TECHNICAL FIELD

The present disclosure relates to soft-output equalization in a receiver.

BACKGROUND

When a transmitter transmits a digital data sequence to a receiver across a dispersive channel, the receiver may employ equalization to estimate the most likely digital data sequence that was transmitted, based on observed noisy received signal samples taken at the receiver. When the transmitter performs channel encoding for forward error correction (FEC), an FEC decoder at the receiver benefits from reliability information for the bits conveyed by equalized data generated at the receiver by the equalization based on the received signal samples. FEC decoding at the receiver may rely on soft-output (SO) equalization; however, for non-binary, multilevel modulation, the computational effort/complexity and amount of storage associated with SO equalization grows with constellation size of the modulation.

BRIEF DESCRIPTION OF THE DRAWINGS

FIG. 8 is a table that summarizes indexing for competitor path-difference metric array storage for the SOV equalization, according to an example embodiment.

FIG. 11B is a flowchart of an example method of multilevel (SOV) trellis processing performed by the SOV equalization/decoding, according to an example embodiment.

FIG. 11C is a flowchart of an example method of chunk processing performed in connection with the SOV equalization/decoding, according to an example embodiment.

DESCRIPTION OF EXAMPLE EMBODIMENTS

Overview

A receiver performs a method. The method includes receiving, from a communication channel, non-binary multilevel symbols that correspondingly represent multibit labels each including at least a least-significant bit (LSB) and a most-significant bit (MSB). The non-binary multilevel symbols are mapped to the multibit labels according to set-partition labeling, which partitions the non-binary multilevel symbols between a first set and a second set according to a first value and a second value of the LSB, respectively. The method also includes digitizing the non-binary multilevel symbols to produce symbol samples. The method further includes performing Soft-Output-Viterbi (SOV) equalization of the non-binary multilevel symbols based on the symbol samples, to produce decoded symbol information corresponding to the non-binary multilevel symbols.

Example Embodiments

Figure 1:
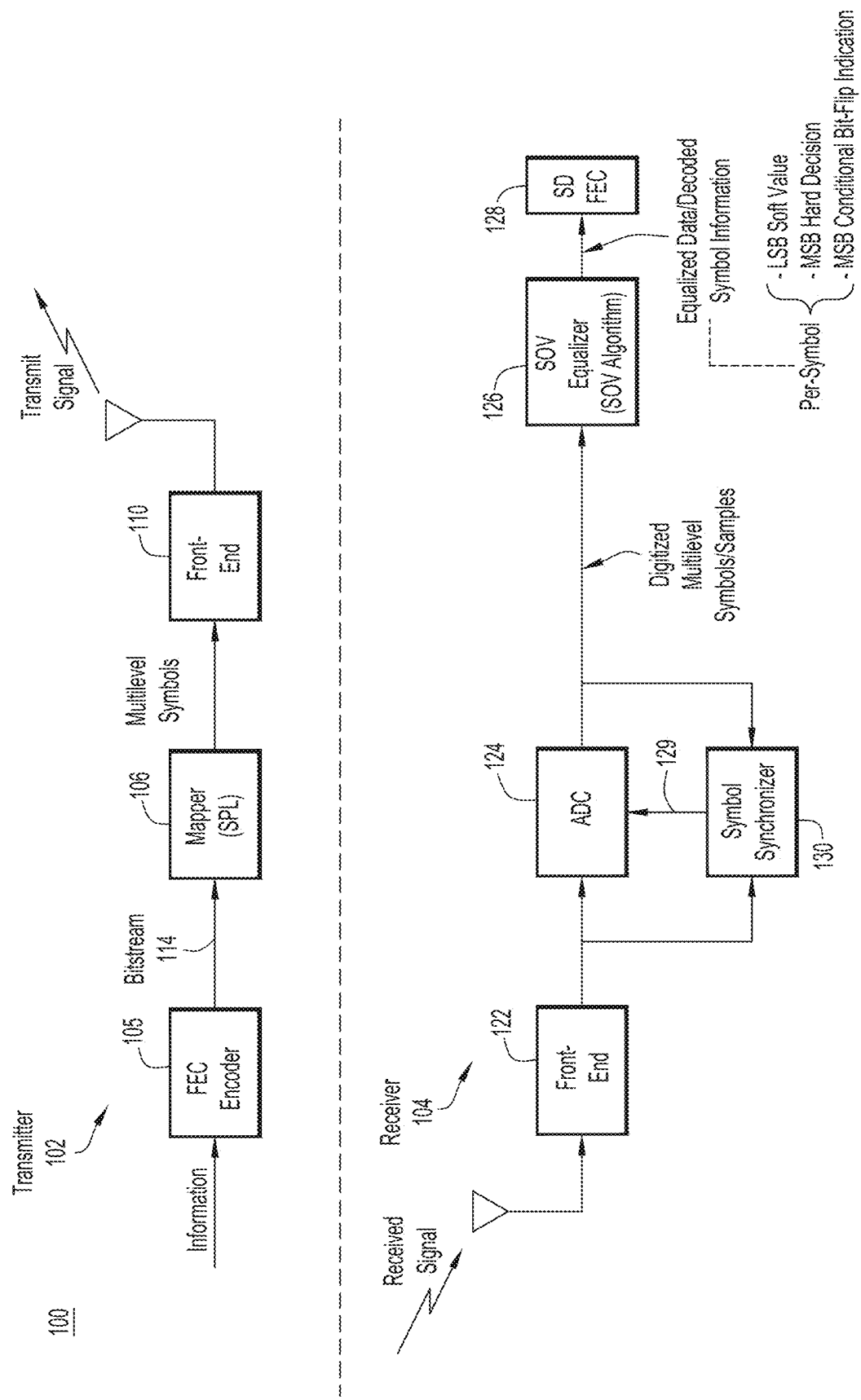
FIG. 1 is a high-level block diagram of a communication system in which embodiments directed to soft-output Viterbi (SOV) equalization may be implemented, according to an example embodiment.

With reference made to FIG. 1, there is a high-level block diagram of an example communication system 100 in which embodiments presented herein may be implemented. Communication system 100 includes a transmitter 102 and a receiver 104. Transmitter 102 includes an FEC encoder 105, a bit-to-symbol mapper 106 (referred to simply as a "mapper 106"), and a transmitter front-end 110. FEC encoder 105 encodes information bits into a bit stream 114 including a sequence of logic bits or binary values (e.g., 11000110), and provides the bit stream to mapper 106. Mapper 106 groups the logic bits of bit stream 114 into a sequence of bit tuples (e.g., bit pairs 11, 00, 01, 10, and so on) and maps or encodes the bit pairs into a sequence of corresponding non-binary, multilevel PAM (e.g., PAM-4) amplitudes or symbols using/according to set-partitioning labelling (SPL) suitable for multilevel coding. In other words, mapper 106 encodes the bit tuples (or groups or multibit labels) into multilevel PAM symbols according to the SPL. Mapper 106 provides the multilevel PAM symbols to transmitter front-end 110. As used herein, the term "symbol" may refer to a multibit label or a bit pair prior to mapping and PAM modulation, or to a PAM amplitude after the mapping and PAM modulation, depending on context.

Transmitter front-end 110 converts the multilevel PAM symbols to a modulated signal that conveys or carries the sequence of multilevel PAM symbols, and transmits the modulated signal (denoted "transmit signal" in FIG. 1) over a communication channel. When the communication channel is a radio frequency (RF) channel, transmitter front-end 110 converts the multilevel PAM symbols to an RF signal that conveys the multilevel PAM symbols, and transmits the RF signal to the RF channel via an antenna. When the communication channel is an optical channel, e.g., and optical fiber, transmitter front-end 110 converts the multilevel PAM symbols to an optical signal that conveys the multilevel PAM symbols, and transmits the optical signal to the optical fiber.

Figure 2:
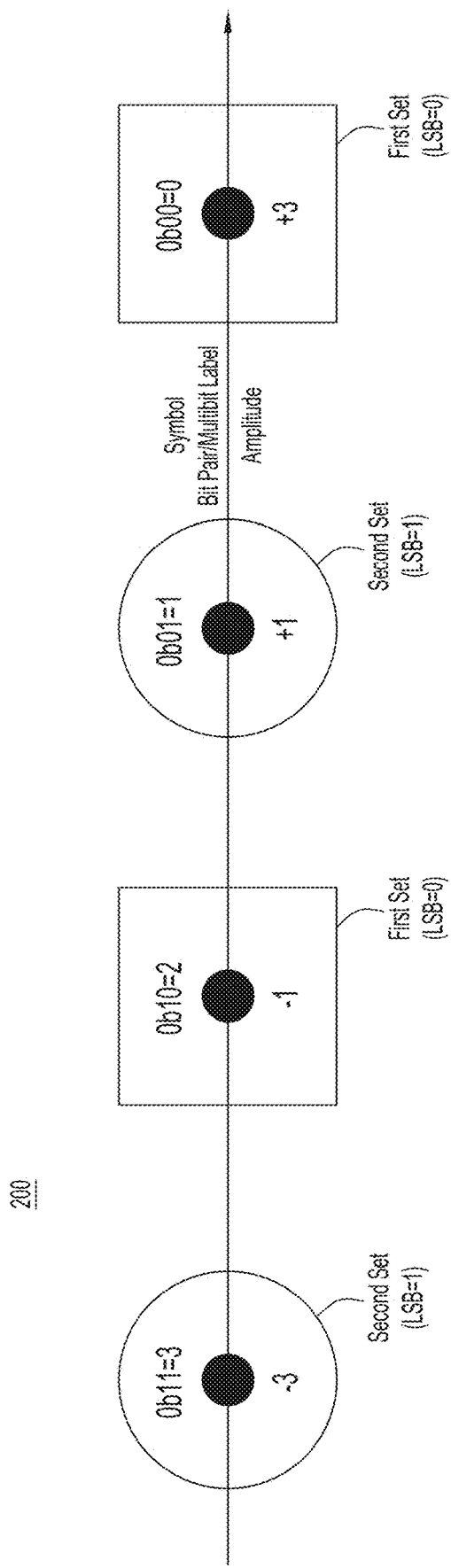
FIG. 2 is an illustration of mapping of bit pairs to pulse amplitude modulation (PAM)-4 symbols using set-partitioning labelling that is exploited by the SOV equalization, according to an example embodiment.

With reference to FIG. 2, there is an illustration of an example mapping 200 of bit pairs to PAM-4 symbols performed by mapper 106 using SPL for multilevel coding. In FIG. 2, the label prefix "0b" means "binary." The PAM-4 symbols are separated from each other along a signal axis. As shown, mapper 106 maps the bit pairs, referred to as "multibit labels," according to the following SPL rule (multibit label→amplitude/multilevel symbol):

00→+3.
01→+1.
10→−1.
11→−3.

In the SPL rule above, each multibit label (e.g., bit pair 01) includes a right-most bit (e.g., 1) and a left-most bit (e.g., 0), which are considered a least-significant bit (LSB) and a most-significant bit (MSB) of the multibit label, respectively. The SPL rule defines a constellation mapping that establishes a relationship between each multibit label and its corresponding physical amplitude, and thus multilevel symbol. The constellation mapping relates each multibit label with one physical amplitude from the set {−3, −1, +1, +3} in the example of FIG. 2, although other constellation mappings are possible. The SPL rule partitions or divides the physical amplitudes into first and second sets based on first and second values of the LSB of the multibit label. For example, LSB=0 defines the first set to include amplitudes +3 and −1 (distance=4), and LSB=1 defines the second set to include amplitudes +1, −3 (distance=4). Such set partitioning offers advantages over conventional encoding (e.g., Gray coding) with respect to equalizing/detecting the multilevel symbols and their corresponding multibit labels at receiver 104, as will be described below.

Returning to FIG. 1, receiver 104 includes a front-end 122, an analog-to-digital converter (ADC) 124, an SOV equalizer 126, and a soft-decision (SD) FEC decoder (SD FEC) 128. Front-end 122 receives from the communication channel a receive signal that conveys the sequence of multilevel symbols transmitted by transmitter 102. The receive signal represents the transmit signal impaired by dispersion and noise introduced by the communication channel. When the transmitted signal is an RF signal, front-end 122 converts the RF signal to an analog signal and provides the analog signal to ADC 124. When the transmit signal is an optical signal, front-end 122 converts the optical signal to the analog signal. In the ensuing description, the "multilevel symbols" may be referred to simply as "symbols."

ADC 124 digitizes the sequence of symbols conveyed by the analog signal based on a sample-timing signal 129 derived by a symbol synchronizer 130, to produce a sequence of (digitized) multilevel symbol samples. Symbol synchronizer 130 derives sample-timing signal 129 using any known or hereafter developed symbol synchronization technique. The symbol samples may include one or more symbol samples (referred to simply as "samples") per symbol. Each sample may include a multibit word that represents a symbol amplitude. For example, each multibit word may be an 8-bit word that includes a 7-bit magnitude and a sign bit. Receiver 104 may optionally include a symbol conditioner (not shown) following ADC 124 to condition (e.g., to perform offset-control of) the samples prior to providing the samples to SOV equalizer 126. In the embodiments presented herein, each sample represents one symbol, i.e., there is a 1-to-1 correspondence between samples and symbols, in which case the terms "symbol" and "sample" may be used interchangeably. In other embodiments, multiple samples may represent each symbol, e.g., the sample rate is at least twice the symbol rate.

SOV equalizer 126 includes an SOV algorithm that performs channel-dispersion equalization of the symbols represented by the samples from ADC 124, to produce equalization data or symbols. The channel-dispersion equalization may also be considered "soft-output decoding" or "estimating" of the symbols. The SOV algorithm applies multilevel trellis/Viterbi processing to the symbols to produce the equalization data, also referred to as "decoded symbol information." The decoded symbol information includes soft values and hard decisions representative of the multibit labels corresponding to the symbols processed by the SOV algorithm. More specifically, for each symbol represented by the samples provided to the SOV algorithm, the SOV algorithm generates, as the decoded symbol information:

a. A soft value for the LSB (i.e., an LSB soft value) of the multibit label corresponding to the symbol.
b. A hard decision for the MSB (i.e., an MSB hard decision) of the multibit label.
c. A conditional correction or "bit-flip" indication (which may also be referred to as a "flip-bit" indication) for the MSB that indicates that the MSB hard-decision should be flipped when SD FEC 128 determines/indicates that the LSB soft-value corresponding to the MSB hard-decision is incorrect, i.e., that the sign of the LSB soft value is incorrect.

The SOV algorithm takes advantage of the above-described combination of multibit label-to-amplitude mapping and SPL in order to reduce computational complexity and storage space used by the SOV equalization, compared to conventional techniques. The reduced computational complexity and storage space represents a technical improvement over the conventional techniques.

SOV equalizer 126 (i.e. the SOV algorithm) provides the decoded symbol information, i.e., the LSB soft values, MSB hard decisions, and conditional MSB bit-flip indication per symbol to SD FEC 128. SD FEC 128 performs SD FEC decoding and MSB correction based on the soft values, the hard decisions, and bit-flip indications from SOV equalizer 126.

Embodiments directed to the SOV algorithm are now described in connection with FIGS. 3-11C. At a high-level, the SOV algorithm provides a low-complexity solution for soft-output (i.e., soft-value) equalization of channel data mapped to non-binary (i.e., higher-order) modulation, such as PAM-4, or more. The embodiments presented herein are described in the context of PAM-4 modulation by way of example, only. It is understood that the embodiments apply equally well to other types of non-binary, multilevel modulation.

For PAM-4 modulation, when intersymbol interference (ISI) spans 3 symbols transmitted over a communication channel, it can be said that the communication channel has a memory of two symbols, each comprising two bits. At receiver 104, the communication channel can be modeled as a state machine having an output that is dependent on a previous state and a current symbol. Accordingly, the SOV algorithm models the communication channel as a shift-register process, which can be visualized as a multilevel trellis diagram.

The shift-register process employs a shift register that comprises memory elements to store representations of symbols, i.e., multibit labels/bit pairs. At any instant in time, the shift register has a state that is fully defined by the content of the memory elements. Inputting a symbol (i.e., a bit pair) to the shift register at that time triggers a state transition. The state transition may be visualized by a branch connecting two states of the multilevel trellis diagram. The cardinality of the symbol set defines how many branches emerge from and merge into any state. For PAM-4, the cardinality is 4 and, with a desired impulse response (DIR) length 3, the state is 2 symbols wide, i.e. 4-bits wide.

Figure 3:
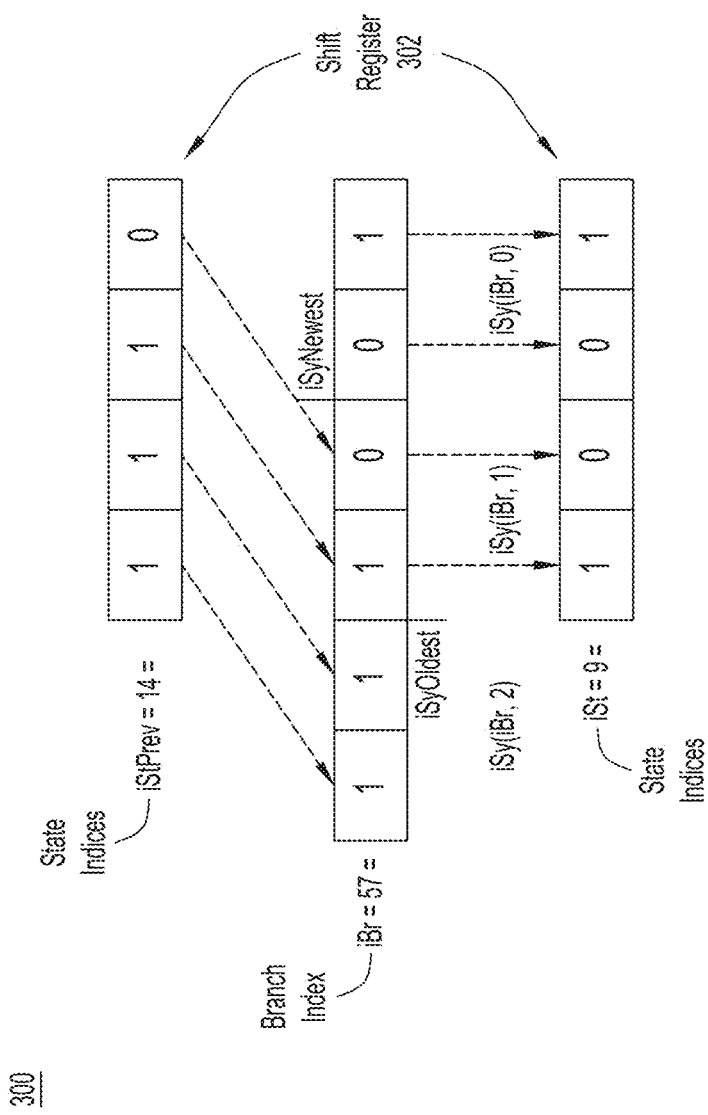
FIG. 3 shows a "left-shift convention" shift-register process that defines symbol, state, and branch indices, and which may be visualized using a corresponding multilevel trellis diagram of the SOV equalization, according to an example embodiment.

There are number of different ways to choose state and branch indices based on the contents of the shift register, which result in a corresponding number of different arrangements for the shift register process. One such arrangement, referred to as a "left-shift convention," is shown in FIG. 3. FIG. 3 shows an example "left-shift convention" shift-register process 300 that may be visualized using a corresponding multilevel trellis diagram. Shift-register process 300 defines symbol, state, and branch indices. Shift-register process 300 includes shift register 302 having a sequence of 2 pairs of memory elements to store a sequence of 2 symbols (i.e. multibit labels/bit pairs) at an instant in time, with each new input symbol arriving from the right-hand side, such that contents of the shift register shift left with each new arrival. Thus, shift register 302 forgets an oldest symbol iSyOldest on the left and obtains a newest symbol iSyNewest on the right. Shift-register process 300 includes a progression of states defined by their indices from a previous state index iStPrev (i.e., a previous state at the top) via a branch with index iBr to a current state index iSt (i.e., a current state at the bottom). In the example, two new bits iSyNewest=0b01 are augmented with the previous state iStPrev=0b1110 to obtain branch index iBr=0b111001. Left-shifting the previous state index iStPrev=0b1110 for the previous state obtains the current state index iSt=0b1001 for the current state.

Figure 4:
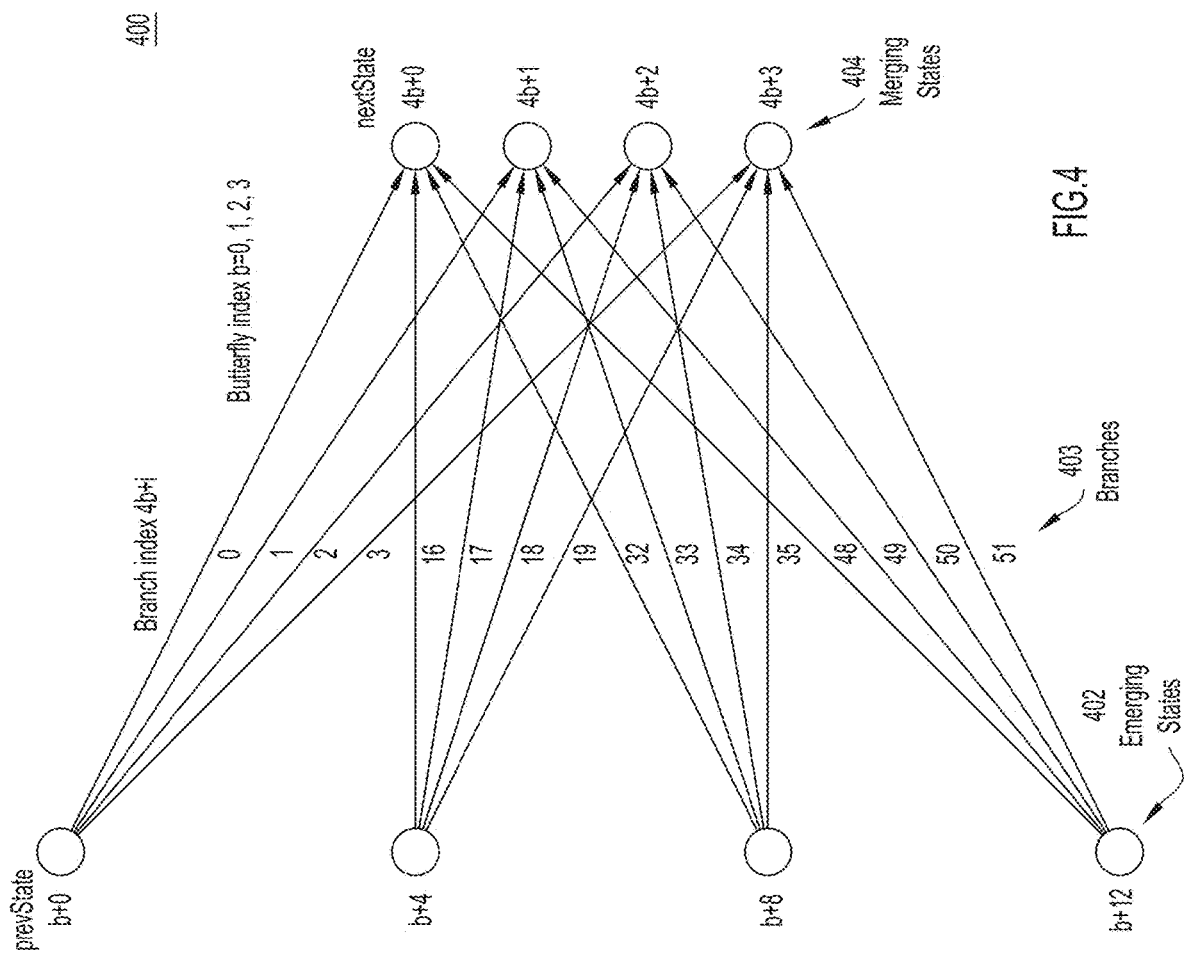
FIG. 4 is an illustration of a butterfly construct or element corresponding to the shift-register process of FIG. 3, according to an example embodiment.

With reference to FIG. 4, there is an illustration of an example butterfly construct or element 400 for the left-shift convention described above in connection with FIG. 3. In FIG. 4, "b" represents a butterfly index/identifier. Butterfly element 400 represents a basic signal-graph unit comprising four emerging states 402 connected by 16 branches 403 to four merging states 404. That is, butterfly element 400 represents a Radix-4 butterfly element that the SOV algorithm may use as a basic building block for a 16-state trellis for PAM-4 equalization. Butterfly element 400 constitutes a self-contained trellis segment, which aggregates all dependent processing to be performed between four emerging states 402 and four merging states 404. Since there is no state-access conflict, multiple instances of butterfly element 400 (i.e., multiple butterfly elements) may be processed independently in parallel. Within one butterfly element, there are often symmetries for the branch metrics, which may be exploited for an even more advantageous implementation.

Figure 5:
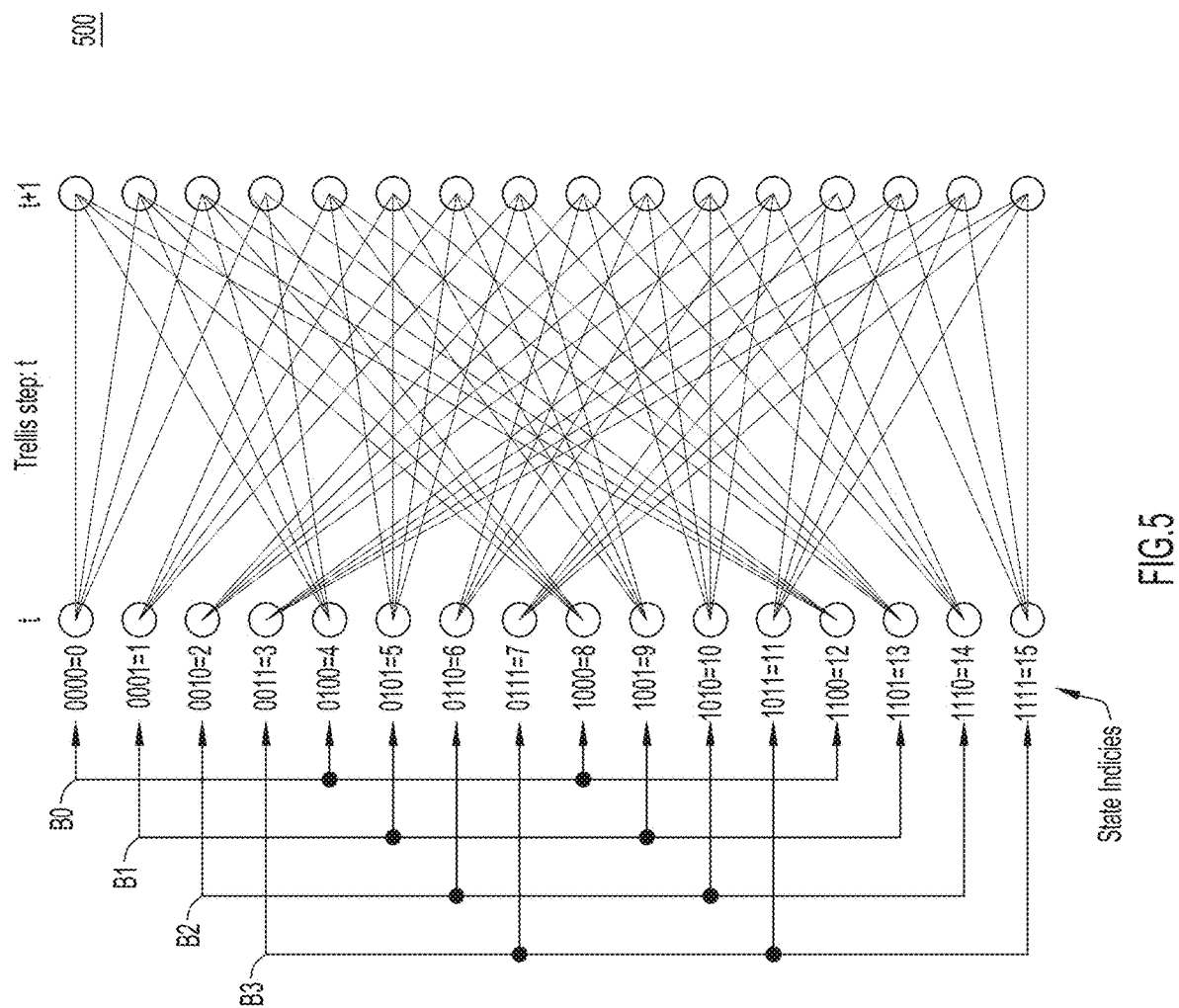
FIG. 5 is an illustration of the full (or complete) 16-state trellis step for PAM-4 equalization on a 3-tap communication channel constructed using four instances of the butterfly element of FIG. 4, according to an example embodiment.

With reference to FIG. 5, there is an illustration of an example complete 16-state trellis step 500 for PAM-4 equalization on a 3-tap communication channel constructed using butterfly element 400 of FIG. 4. Specifically, building block butterfly element 400 (e.g., the Radix-4 butterfly element) is instantiated 4 times for butterfly indices b=0 (B0), b=1 (B1), b=2 (B2), and b=3 (B3) to construct 16-state trellis step 500 representing one trellis step at time instant t. The top-most row gives array indices (time) to indicate how to index the evolution of arrays for branch and state metrics, when storing the values for consecutive time instants. For b=B2 in FIG. 5, one can observe the particular state transition from state 14 to 9, described previously in connection with FIG. 3.

The SOV algorithm models the sequence of received signal values (i.e., samples) as possible paths through a trellis comprising states and branches. The SOV algorithm expects to observe a certain nominal branch coefficient during a transition from one state to another. Since these observations are not noise free, the SOV algorithm computes distances between the actual observation and the nominal coefficients. Finally, the SOV algorithm makes a decision in favor of the most likely path through that trellis given the entire sequence of noisy observations. The SOV algorithm includes 3 main components:

a. A hard-decision Viterbi algorithm, which is good for determining the ML sequence through a trellis based on noisy observations of a dispersive channel output. This generates hard decisions for the MSB and the LSB. This may be sufficient when a receiver does not include an SD FEC that can consume soft values, but it may not be sufficient when there is an SD FEC, such as SD FEC 128 following SOV equalizer 126 in receiver 104.

b. Maintenance of additional likelihood characteristics, which enables generation of a soft value for each symbol (and the bits associated with that symbol) associated with a trellis transition. In the embodiments presented herein, soft values are used for the LSB only, while for the MSB a conditional hard decision correction/bit-flip indication (i.e., the MSB conditional bit-flip) is sufficient. When this indication is set to true, the hard decision MSB should be flipped when subsequent SD FEC decoding indicates that the sign of the soft value associated with the LSB was incorrect.

c. Update of branch coefficients according to long-term statistics of observations and data decisions. This non-parametric tracking allows learning the time-varying channel properties. This may be both, linear and non-linear effects.

Before describing operations of the SOV algorithm in detail, several metrics used by the SOV algorithm are described, briefly. The SOV algorithm uses samples (i.e., symbol amplitudes) as an input metric. As shown in FIG. 2, the relationship between an amplitude and a multibit label for a modulated symbol is established by the example constellation mapping, which relates each multibit label with one amplitude from the set $\{-3, -1, +1, +3\}$, for PAM-4 modulation. The SPL mapping is different from conventional Gray coding/mapping, which establishes a limited Hamming distance of only 1 between adjacent symbols. In contrast, the mapping used herein follows SPL for multilevel coding, which increases the Euclidean distance for detecting/decoding the MSB for a symbol from 2 to 4, when the LSB of the symbol is known, such that the symbol is either in the first set (e.g., LSB=0) or in the second set (e.g., LSB=1) of signal points established by the SPL, as described above in connection with FIG. 2. This increase in Euclidean distance for the MSB allows for protecting only the LSB via channel coding, and represents a technical improvement over encoding schemes that result in a smaller Euclidean distance. In a simple symbol-by-symbol decision when the communication channel is non-dispersive, the reliably decoded LSB information may be fed toward uncoded MSB detection. According to the embodiments presented herein, the SOV algorithm produces the MSB hard decision together with the conditional bit-flip indication that the MSB (hard decision) should be corrected (i.e., flipped) when subsequent SD FEC decoding corrects the LSB soft value.

The SOV algorithm uses Squared Euclidean Distance (SED) as an internal metric. To achieve Maximum-Likelihood (ML) detection, branch transitions and states described above and further below are associated with probabilities for signal perturbation. Under the assumption of a signal amplitude perturbed by Gaussian noise, SED is the optimum metric when the SOV algorithm works in a log-probability domain. The latter keeps requirements on dynamic range for equalizer-internal metrics low. Hence, the SOV algorithm uses SED for branch metrics. When branch metrics are SED, the state metrics and the delta metrics are also SED in nature. This either can be approximated or generalized SED.

The SOV algorithm uses Log-Likelihood Ratio (LLR) as an output metric. For example, the SOV algorithm produces each LSB soft value of the equalization data/decoded symbol information as an LLR. The LLR may be approximated as a difference between the two SEDs associated with the most likely hypothesis for the LSB either being 1 or 0.

Figure 6:
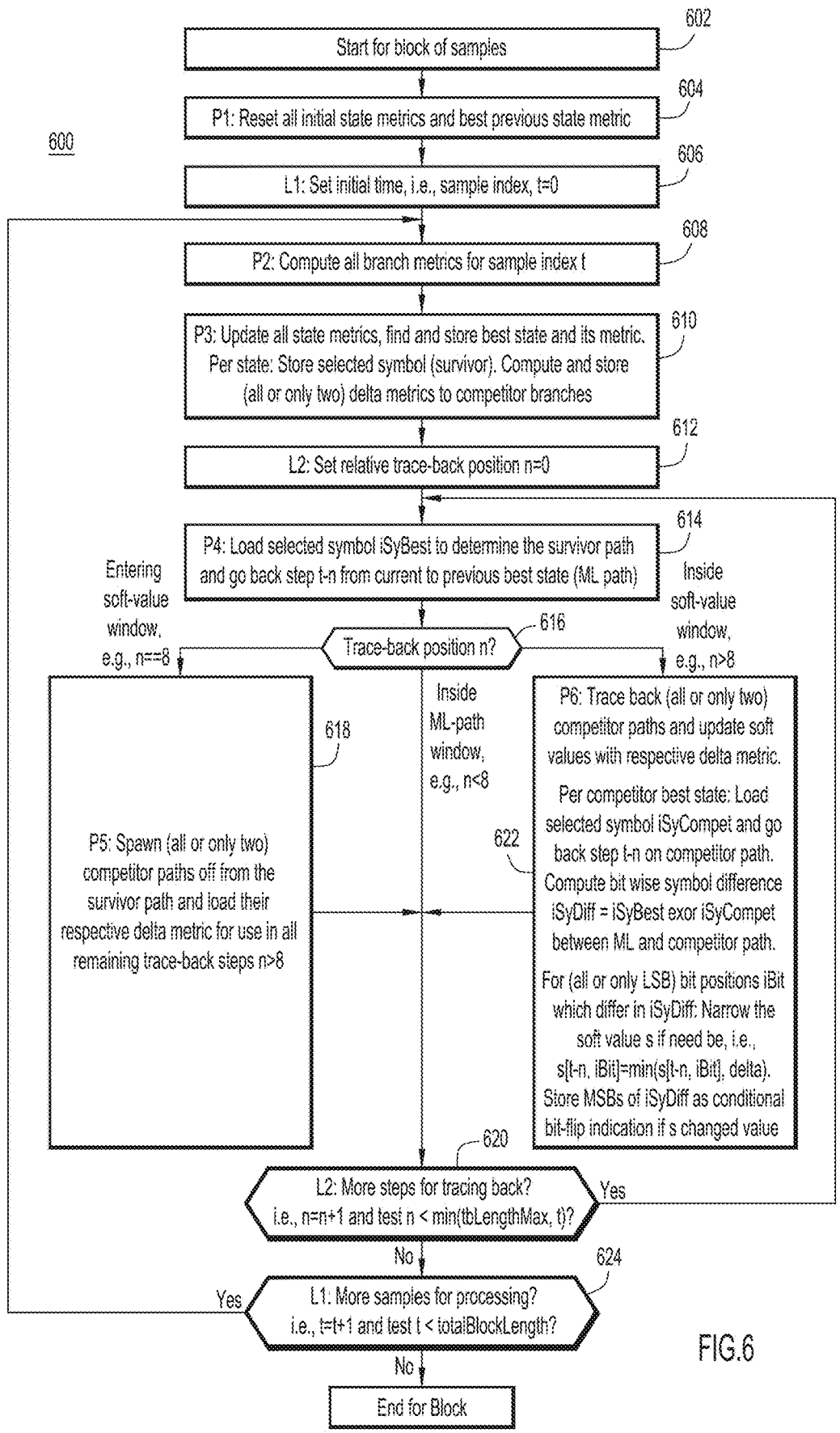
FIG. 6 is a flowchart of a method of SOV equalization/decoding performed in a receiver of the communication system, according to an example embodiment.

The SOV algorithm is now described in further detail with reference to FIG. 6. FIG. 6 is a flowchart of example operations 600 performed by the SOV algorithm. FIG. 6 is described also with reference to SOV pseudocode listed below. The SOV pseudocode presents specific implementation details for operations 600. The SOV algorithm sequentially processes successive overlapping blocks of symbols/samples using operations 600, one block after the next. For example, over time, the SOV algorithm performs operations 600 on a previous block, a current block, and on a next block, in sequence. For convenience, operations 600 and the pseudocode cross-reference each other using labels "Px" and "Lx," where Px denotes a particular processing operation and Lx denotes a particular processing loop in the flowchart of FIG. 6. The ensuing description uses the terms "symbol"/"symbols" interchangeably with the terms "sample"/"samples" since the described embodiment uses 1 sample per symbol.

At 602, the SOV algorithm receives a (current) block of samples, which represents 64 symbols, for example.

At 604, the SOV algorithm resets initial state metrics and a best previous state metric.

At 606, the SOV algorithm initializes, and begins, an outer loop L1. The SOV algorithm sets an initial time t (i.e., sample index) to t=0. The outer loop L1 will process the block of samples from oldest to newest samples (e.g., from left-to-right).

At 608, the SOV algorithm computes all branch metrics for the time instant t.

At 610, the SOV algorithm updates all state metrics, and finds and stores a best state and its associated metric. For each state (i.e., per state), the SOV algorithm stores a selected symbol (survivor). The SOV algorithm computes and stores (all or only two) delta metrics to competitor branches.

At 612, the SOV algorithm initializes, and begins, an inner loop L2 that will perform trace-back processing for competitor paths. Trace-back processing performs soft-value updates on the competitor paths. The SOV algorithm sets a relative trace-back position n to n=0.

At 614, the SOV algorithm loads a selected symbol iSysBest to determine a survivor path, and goes back step t−n from a current best state to a previous best state (i.e. the ML path).

At 616, the SOV algorithm evaluates the trace-back position with respect to a threshold or maximum value for n (e.g., n=8), e.g., whether the trace-back position is equal to, less than, or greater than the maximum value.

a. When the trace-back position has reached the maximum value (e.g., n=8), this indicates the SOV algorithm is entering a soft-value window, and flow proceeds to 618.

b. When the trace-back position is less than the maximum value (e.g., n<8), this indicates the SOV algorithm is inside an ML-path window, and flow proceeds directly to 620.

c. When the trace-back position exceeds the maximum value (e.g., n>8), this indicates the SOV algorithm is inside the soft-value window, and flow proceeds to 622.

At 618, the SOV algorithm spawns (all or only two) competitor paths off from the survivor path and loads their respective delta metrics for use in all remaining track-back steps (e.g., for n>8). Flow proceeds to 620.

At 622, the SOV algorithm traces-back, i.e., performs processing on, (all or only 2) competitor paths and updates soft values with respective delta metrics. Per competitor best state: the SOV algorithm (i) loads the selected symbol iSyCompet and goes back step t−n on the associated competitor path; and (ii) computes the bit-wise symbol difference iSyDiff=iSysBest XOR iSyCompet between the ML path and the competitor path. Also, for (all or only the LSB) bit positions iBit which differ in iSyDiff, narrow the soft value "s" if need be, i.e., s[t−n, iBit]=min(s[t−n, iBit], delta). Store MSBs of iSyDiffas conditional bit-flip indication if soft value s changed value. Flow proceeds to 620.

At 620, the SOV algorithm determines whether there are more steps for trace-back (i.e., whether to stay in loop L2). If yes, flow returns to 614. If no, flow proceeds to 624.

At 624, the SOV algorithm determines whether there are more samples of the block to process (i.e., whether to stay in loop L1 because the block processing has not yet completed). If yes, flow returns to 608. If not, the process ends for the (current) block.

The following SOV pseudocode provides the details for the processing steps (Px) and loops (Lx) associated with the flowchart of FIG. 6. In the SOV pseudocode, comments are preceded by delimiter "//" and bolded.

// P1: Reset all nStates initial state metrics and best previous state metric stateMetricBestPrev=0
For all states iSt=[0, nStates)//i.e. interval includes 0 but excludes nStates stateMetric[t=0][iSt]=0
// L1: Process the block of samples from left (oldest) to right (newest)
For time instants, i.e. input sample indices, t=[0, totalBlockLength)
// P2: Compute all nBranches branch metrics for this time instant t
For all branches iBr=[0, nBranches)
//Per branch: Compute squared Euclidean distance between received and nominal signal
branchMetric[t][iBr]=(inputBuf[t]−branchCoeff[iBr])$^2$
// P3: Update all nStates state metrics and find best destination state iStBest
For destination states iSt=[0, nStates)
// Per destination state: Update path metric and store selected symbol iSyBest (survivor)
For iSy=[0, nSymbols) determine branch iBr(iSt, iSy) terminating in iSt pathMetricAcs[iSy]=stateMetric[t][iStPrevBr(iBr)]+branchMetric[t][iBr]
// Store survivor-path symbol iSyBest associated and normalized state metrics selectedSymbol[t][iSt]=iSyBest
stateMetric[t+1][iSt]=pathMetricAcs[iSyBest]−stateMetricBestPrev
// Compute and store delta metrics for later use by soft-value update
For symbol errors iSyDelta=[1, nSymbols)/inventive step: only 1 and 3 iSyCompet=iSyBest^iSyDelta (bit-wise exclusive or)
deltaMetric[t][iSt].d[iSyDelta−1]=pathMetricAcs [iSyCompet]−pathMetricAcs[iSyBest]
// Store overall best state after trellis step t and its metrics
stateBestIdx[t]=iStBest
stateMetricBestPrev=stateMetric[iStBest]−pathMetric-SubPrev
// L2: Trace back survivor and competitor paths for at most tbLengthMax steps
For n=[0, min(tbLengthMax, t))
// P4: Load symbol associated with survivor and go back step t-n to previous best state
iSyBest=selectedSymbol[t−n][iStBest]
iStBest=iStPrev(iStBest, iSyBest)
If n enters the soft-value update window (e.g. at n=8)
// P5: In parallel: Spawn competitor paths off from survivor path
For symbol errors iSyDelta=[1, nSymbols)/Trace-back only δ1 and δ3
iSyCompet[iSyDelta]=iSyBest^iSyDelta (bit-wise exclusive or)
iStCompet[iSyDelta]=iStPrev(iStBest, iSyCompet[iSyDelta])
delta[iSyDelta]=deltaMetric[t−n][iStBest].d [iSyDelta−1]
If n is inside the soft-value update window (e.g. n>8)
// P6: In parallel: Trace back competitor paths and update soft values
For symbol errors iSyDelta=[1, nSymbols) // Track-back only δ1 and δ3
// Previous state on competitor path
iSyCompet=selectedSymbol[t−n][iStCompet [iSyDelta]]
iStCompet[iSyDelta]=iStPrev(iStCompet [iSyDelta], iSyCompet)
// Symbol mismatch between survivor and competitor path
iSyDiff=iSyBest^iSyCompet (bit-wise exclusive or)
// Soft-value update, i.e. conditional narrowing of belief
For bit positions iBit set in iSyDiff (i.e. when competitor bit differs from survivor)
softVal[t−n, iBit]=min(softVal[t−n, iBit], delta [iSyDelta])
// Only perform soft-value update for LSB (iBit=0)
// Conditional update of correction indication for hard decision
// Obtain one single-bit conditional correction indication per MSB
if softVal[t−n, 0] changed value, i.e. the above min( ) replaced the old value:
store MSB(s) of iSyDiff as correction indication for the corresponding MSB(s)
// for PAM4, we have only one MSB per symbol, i.e. store (iSyDiff>>1) & 1

An advantage of the SOV algorithm is that it performs massively parallel processing. To do this, the SOV algorithm performs chunk processing that divides or breaks the received stream of samples (i.e., symbols for one sample per symbol) into successive blocks or chunks of the samples, overlaps the successive chunks to form overlapping chunks, and then processes the overlapping chunks in parallel. Such overlap processing of the chunks breaks dependency between the chunks, which allows for cold-starting state metrics in their all-zero state during processing of overlap-left samples, described below. That is, no output is generated for overlapping sample regions of chunks so as to increase detection quality that would otherwise suffer from state metric and delta metric transients on the left side of a chunk (i.e., oldest samples of the chunk) and insufficient trace-back length on the right side of the chunk (i.e., the newest samples of the chunk), as is now described in connection with FIG. 7.

Figure 7:
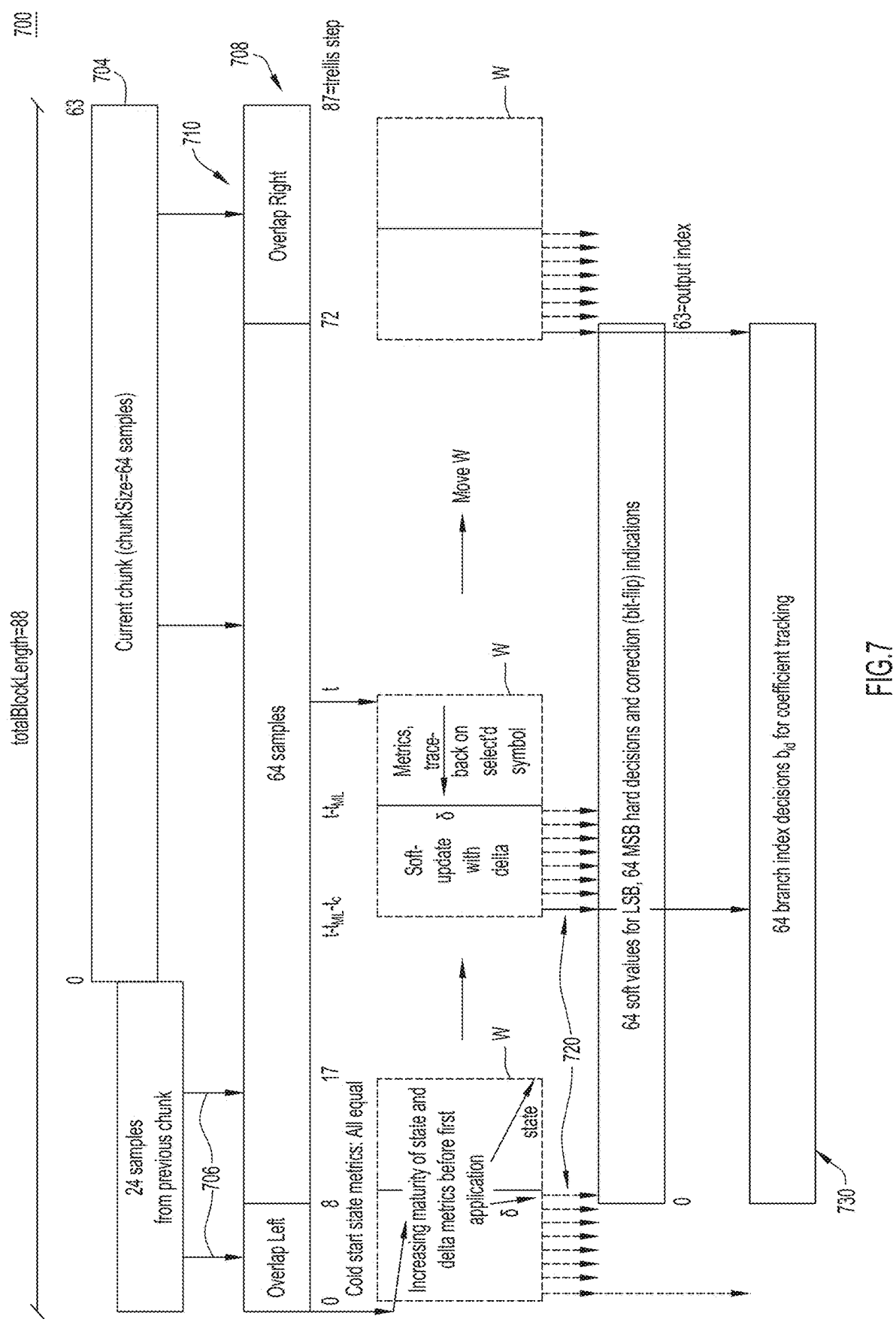
FIG. 7 is an illustration of block or chunk processing performed by the SOV equalization, according to an example embodiment.

FIG. 7 is an illustration of example scheduling 700 of the chunk processing that shows input samples and output data corresponding to the scheduling. FIG. 7 shows the chunk processing during a current cycle of the chunk processing, i.e., at a time when the chunk processing has received a current chunk 704 that has not been processed, and after the chunk processing has processed a previous overlapping chunk during a previous cycle. In FIG. 7, symbols indicated on the left are older than those indicated on the right. Also, chunk processing moves vertically down FIG. 7, generally, in order to minimize memory size requirements and achieve low signal latency.

The chunk processing appends overlap-left samples 706 (e.g., 24 samples—also referred to as "leading overlap symbol samples") of a previous chunk that was previously processed by the chunk processing to the beginning of current chunk 704 (e.g., 64 samples), to form a current overlapping chunk 708 (e.g., 88 samples). That is, current overlapping chunk 708 includes current chunk 704 concatenated with overlap-left samples 706. Current overlapping chunk 708 also includes overlap-right samples 710 that have not been processed (referred to as "trailing overlap symbol samples") that will form overlap-left samples for the next chunk after they are processed. Thus, current overlapping chunk 708 includes overlap-left samples 706, overlap-right samples 710, and middle samples that have not been processed between the overlap-left and overlap-right samples.

Chunk processing defines a moving soft-value window W of samples (e.g., that spans 16 samples) within current overlapping chunk 708. The number of samples covered by soft-value window W at any given time is less than the number of samples in current overlapping chunk 708.

The chunk processing incrementally slides a position of soft-value window W across current overlapping chunk 708 over time, from/starting with overlap-left samples 706 at the beginning of the current overlapping chunk to overlap-right samples 710 at the end of the current overlapping chunk. FIG. 7 shows 3 example positions of soft-value window W, including a left-most position, a middle position, and right-most position. At each position of soft-value window W, the chunk processing processes the samples within the soft-value window to update soft-values of LSBs, to produce LSB soft values and MSB hard decisions with their accompanying conditional bit-flip indications, as indicated at 720.

Soft-value window W is shown in dashed line at its left-most position. In the left-most position, soft-value window W starts to "fill," as indicated by 8 arrows originating from the bottom of the window. Then, the first ML-path trace-back is started at position tbStartPosForDv=17, to update the soft value in trellis step tracebackPosComp=8, i.e., at output index 0. In a next step, an ML-path is traced starting at position 18, to update output index 1 and 0. Soft-value window W is full for trace-backs from positions 24 through 80. Soft-value window W is shown in dashed lined at its right-most position. In the right-most position, soft-value window W tapers off until a single output value is updated for the trace-back from position 87.

As soft-value window W traverses current overlapping chunk 708, the window generates 64 soft values, and 64 MSB hard decisions and possible correction indications (the conditional bit-flips), for the current overlapping chunk. That is, soft-value window W generates one LSB soft value and one MSB hard decision and accompanying correction indication corresponding to each processed symbol. Then, at 730, the chunk processing generates branch index decisions for coefficient tracking based on the LSB soft values and MSB hard decision.

As mentioned above, the SOV algorithm performs multilevel trellis processing. The multilevel trellis processing constructs, in a multilevel trellis, an ML path associated with/indicative of an ML symbol represented by an ML multibit label ($MSB_{ML}\ LSB_{ML})_{ML}$ (i.e., an underlying ML symbol), and multiple competitor paths associated with corresponding competitor symbols represented by competitor multibit labels (i.e., underlying competitor symbols) and corresponding delta metrics ($\delta$) with respect to the ML path. In an example, the multiple competitor paths may include:
 a. A first competitor path associated with first competitor symbol A ($MSB_1\ LSB_1)_1$, and a first delta metric.
 b. A second competitor path associated with a second competitor symbol B ($MSB_2\ LSB_2)_2$, and a second delta metric.
 c. A third competitor path associated with a third competitor symbol C ($MSB_3\ LSB_3)_3$, and a third delta metric.

The SOV algorithm determines which of the competitor symbols are flipped-bit competitor symbols that have LSBs that are flipped (i.e., different) with respect to the LSB of the ML symbol. That is, which of LSBs $LSB_1$, $LSB_2$, and $LSB_3$ are flipped compared to LSBs. For example, when $LSB_{ML}=0$, and $LSB_1=1$, $LSB_1$ is considered flipped with respect to $LSB_{ML}$, and thus competitor symbol A is considered a "flipped-bit" (i.e., "bit-flipped") competitor symbol. On the other hand, when $LSB_1=0$, $LSB_1$ is not flipped, and thus competitor symbol A is not a flipped-bit competitor symbol. In an example, the SOV algorithm may perform a bit-wise Exclusive OR (XOR or EXOR) operation between the bit pair for the ML symbol and the bit pair of each competitor symbol, and determine which of the competitor symbols are flipped-bit competitor symbols based on results of the bit-wise XOR.

Once the SOV algorithm determines which of the competitor symbols are flipped-bit competitor symbols, the SOV algorithm may perform trace-back processing to update soft values of LSBs only on/for the competitor paths associated with the flipped-bit competitor symbols, and not on any competitor path that is not associated with a flipped-bit competitor symbol. In other words, the SOV algorithm may ignore the competitor paths that is/are not associated with flipped-bit competitor symbols. Performing trace-back processing for only the competitor paths that are associated with the flipped-bit LSBs reduces processing time and memory usage.

With reference to FIG. 8, there is an example table 800 that summarizes indexing for competitor path-difference metric array storage. Table 800 includes a column 802 that lists delta metrics ($\delta$), a column 804 that lists a bitwise symbol difference iSyDelta for each of the delta metrics, and a column 806 that lists a path enumeration or priority corresponding to each of the delta metrics. Each bitwise symbol difference iSyDelta of column 804 represents a possible bitwise difference between a selected symbol (e.g., an ML symbol) associated with a selected path (e.g., an ML path) and a competitor symbol associated with a competitor path. In this column, logic 1 indicates a flipped bit. For example, logic 0 in the LSB position of iSyDelta indicates the LSB of the competitor symbol is not flipped with respect to the LSB of the ML symbol (i.e., the LSBs are the same). On the other hand, logic 1 in the LSB position of iSyDelta indicates the LSB of the competitor symbol is flipped with respect to the LSB of the ML symbol (i.e., the LSBs are different).

Column 806 lists a high-to-low order A, B, and C in which the SOV algorithm processes competitor paths for soft-value update (i.e., trace-back processing). The high-to-low order A, B, and C for processing the competitor paths is based on the bitwise symbol difference iSyDelta for the competitor symbols associated with the competitor paths (e.g., the bitwise symbol difference between a selected symbol, such as the ML symbol, and the competitor symbol). For example, for a given iSySelected (i.e., for a given row in the table), competitor paths may be labeled as follows: iSyCompet=iSySelected XOR iSyDelta. A targeted visit of competitor paths is therefore achieved when basing the enumeration (A, B, or C) on iSyDelta.

Figure 9:
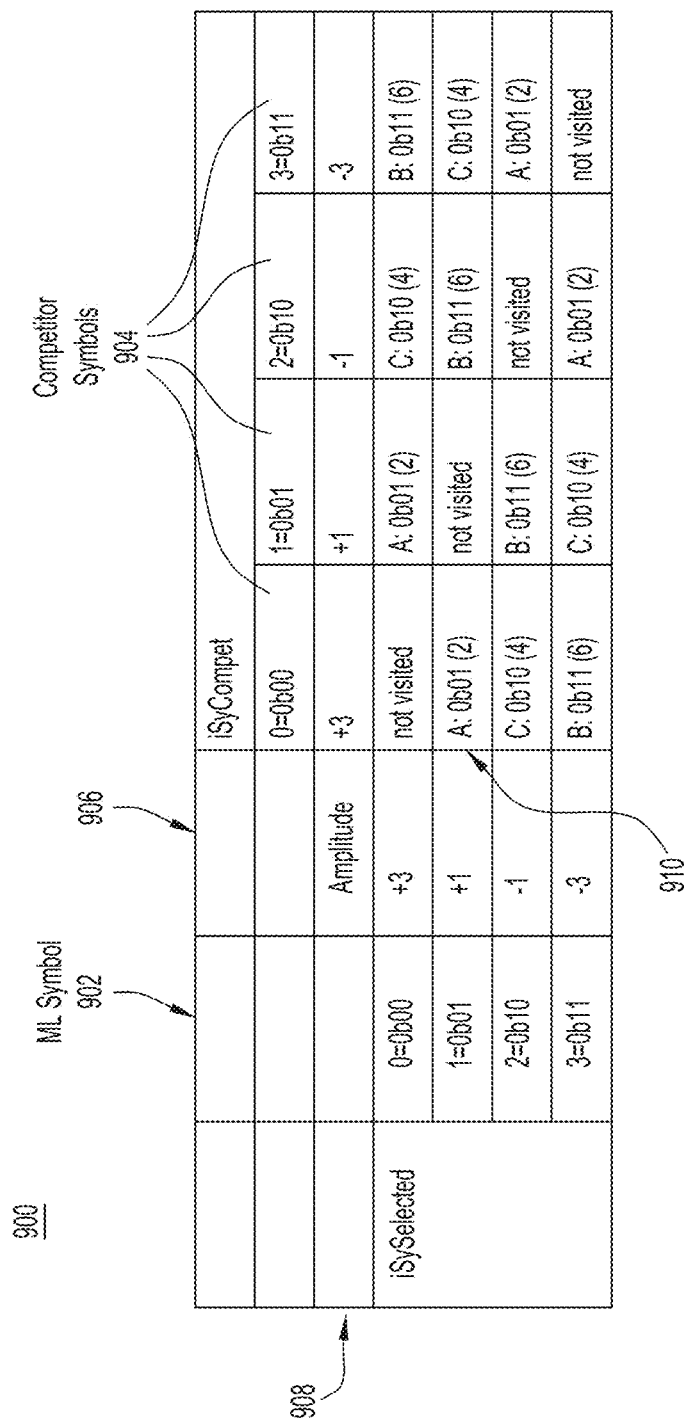
FIG. 9 is a table that shows a specific enumeration of competitor paths for soft-value update processing, according to an example embodiment.

With reference to FIG. 9, there is an example table 900 that shows a more specific enumeration of competitor paths for soft-value update processing, which leads to a symmetric behavior for an order of processing Euclidean distances. Table 900 includes a column 902 that lists (in each of its rows) possible ML symbols denoted "iSySelected" and multiple columns 904 corresponding to possible competitor symbols denoted "iSyCompet." PAM amplitudes corresponding to the aforementioned ML and competitor symbols occupy column 906 and row 908.

At each intersection of a given row and a given column of table 900, an entry includes a priority (e.g., A, B, or C) of a competitor path corresponding to a competitor symbol for the given column of the table, iSyDelta for the competitor symbol relative to the selected symbol, and a distance based on a difference between a PAM amplitude for the competitor symbol and the selected symbol. For example, entry 910, at the intersection of selected symbol 01 and competitor symbol 00, includes (i) priority A based on iSyDelta=01 for the entry, (ii) iSyDelta 01, which indicates competitor symbol 00 has a flipped LSB relative to selected symbol 01, and (iii) distance 2, which is the difference between PAM amplitude +3 for the competitor symbol and PAM amplitude +1 for the selected symbol.

The enumeration shown in table 900 ensures that the nominally nearest neighbor paths are visited first (A) or—when there are two—at most second (B), while the nominally farthest candidate is always visited last (C), or not at all. In other words, the SOV algorithm explores the competitor associated with flipped LSB while keeping the MSB. The second explored competitor is the one associated with flipping both LSB and MSB.

Figure 10:
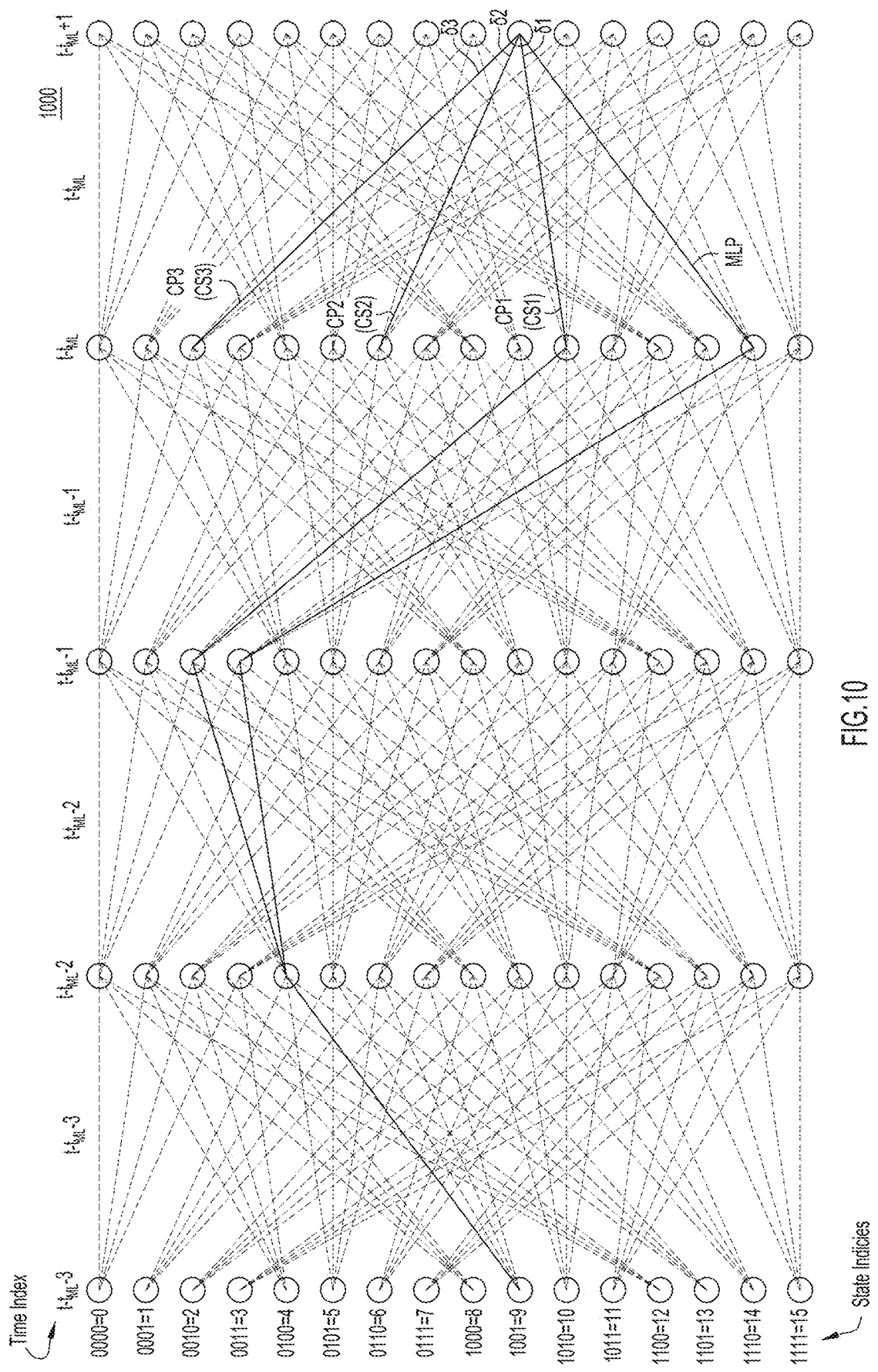
FIG. 10 is an illustration of Maximum-Likelihood (ML) path and competitor paths determined for the SOV equalization in a 16-state trellis for PAM-4 equalization, according to an example embodiment.

With reference to FIG. 10, there is an illustration of an example of using the enumerations presented in tables 800 and 900 to govern trellis path traversal and trace-back in an example 16-state trellis 1000 for PAM-4 equalization. Trellis 1000 includes an ML path MLP and competitor paths CP1, CP2, and CP3 that have been determined by the SOV algorithm. ML path MLP is associated with an ML symbol and competitor paths CP1, CP2, and CP3 are associated with competitor symbols CS1, CS2, and CS3, respectively. The SOV algorithm computes delta metrics $\delta_1$, $\delta_2$, and $\delta_3$ for competitor paths CP1, CP2, and CP3 relative to ML path MLP, respectively. The SOV algorithm computes symbol differences (iSyDelta) between the ML symbol and competitor symbols CS1, CS2, and CS3, to produce bitwise differences (iSyDelta) 01, 10, and 11, respectively (as shown in table 800 of FIG. 8). Thus, only competitor symbols CS1 and CS3 are considered flipped-bit competitor symbols that have LSBs flipped with respect to the LSB of the ML symbol. Accordingly, the SOV algorithm only performs trace-back processing on competitor paths CP1 and CP3 associated with flipped-bit competitor symbols CS1 and CS3 in order to update soft-values of the LSBs for the flipped-bit competitor symbols. That is, the SOV algorithm omits trace-back on competitor path CP2 associated with competitor symbol CS2. Compared to conventional techniques, the technical improvement presented herein reduces memory usage because branch and state metrics/values are not stored/updated for the omitted trace-back competitor path. Moreover, computational complexity is reduced because there is no trace-back processing performed for that path.

Figure 11A:
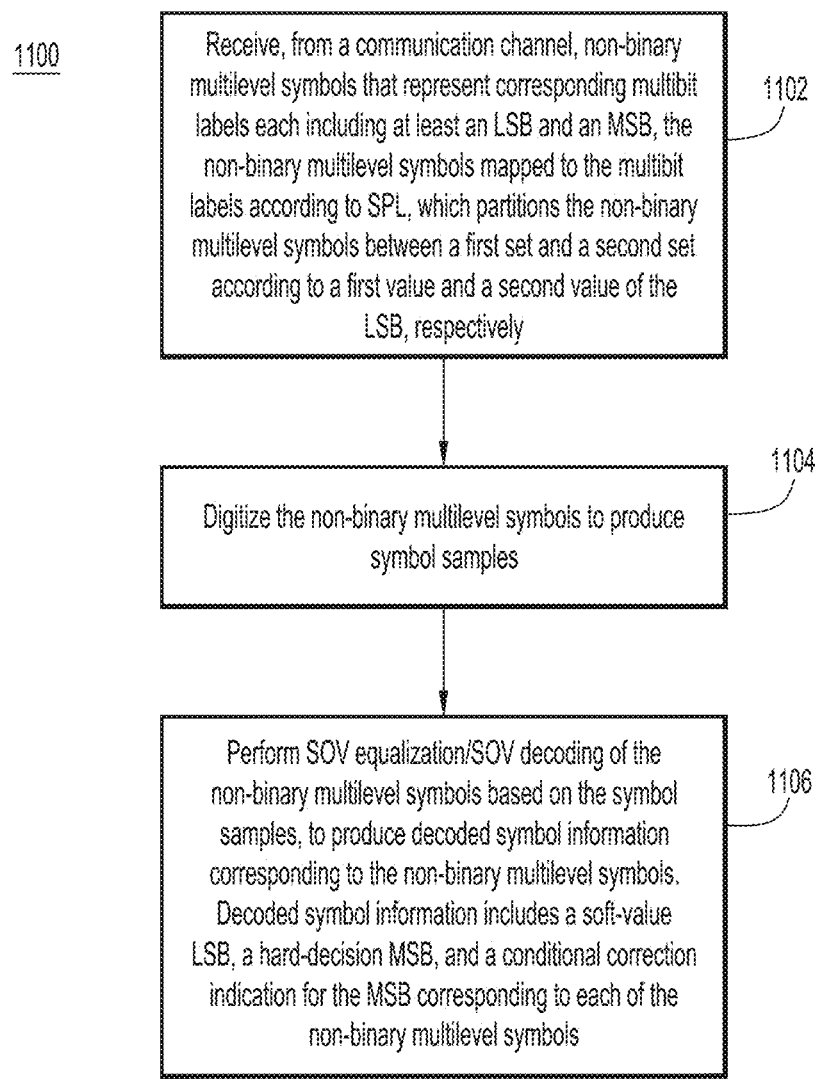
FIG. 11A is a flowchart of an example method of performing SOV equalization/decoding of non-binary multilevel symbols, according to an example embodiment.

With reference to FIG. 11A, there is a flowchart of an example method 1100 of performing SOV equalization/decoding performed in receiver 104. Method 1100 includes operations described above.

At 1102, receiver 104 receives, from a communication channel, non-binary multilevel symbols (e.g., PAM-4 symbols) that represent corresponding multibit labels (e.g., 11, 001, 01, and so on) (i.e., the non-binary multilevel symbols represent corresponding multibit labels) each including at least an LSB and an MSB. The non-binary multilevel symbols are mapped to the multibit labels according to set-partition labeling, which partitions the non-binary multilevel symbols between a first set and a second set according to a first value and a second value of the LSB, respectively. The set-partitioning labeling increases a Euclidean distance between adjacent ones of the non-binary multilevel symbols and thus improves decoding/equalization performance in receiver 104 compared to conventional encoding, such as Gray encoding, especially when the LSB is known.

At 1104, receiver 104 digitizes the non-binary multilevel symbols to produce symbol samples, e.g., multibit words each including magnitude and sign bits.

At 1106, receiver 104 performs SOV equalization, including SOV decoding, of the non-binary multilevel symbols based on the symbol samples, to produce equalization data/decoded symbol information corresponding to the non-binary multilevel symbols. The SOV equalization produces, as the decoded symbol information, a soft-value LSB and a hard-decision MSB representative of a corresponding multibit label for each of the non-binary multilevel symbols. The SOV equalization also produces a conditional correction/bit-flip indication for the hard-decision MSB to indicate that the hard-decision MSB is to be flipped when the soft-value LSB is incorrect.

FIG. 11B is a flowchart of an example method 1120 of multilevel (SOV) trellis processing performed by the SOV equalization/decoding. Method 1120 includes operations described above that expand on the operations of method 1100.

At 1122, for each non-binary multilevel symbol that is received, in a multilevel trellis of possible outcomes, receiver 104 determines (i) an ML path associated with an ML symbol that represents an ML multibit label, and (ii) competitor paths associated with competitor symbols that represent competitor multibit labels.

At 1124, receiver 104 determines, among the competitor symbols, (i) flipped-bit competitor symbols having LSBs that are flipped with respect to an LSB of the ML symbol, and (ii) at least one non-flipped-bit competitor symbol having an LSB that is not flipped with respect to the LSB of the ML symbol (i.e., the LSB of the at least one non-flipped-bit competitor symbol is the same as the LSB of the ML symbol).

At 1126, receiver 104 performs trace-back processing through the multilevel trellis only on the competitor paths associated with the flipped-bit competitor symbols, to update soft values for the LSBs that are flipped. The trace-back processing only updates the soft values for the LSBs that are flipped, but does not update soft values for MSBs of the flipped-bit competitor symbols. Receiver 104 does not perform trace-back processing on the competitor path associated with the at least one non-flipped-bit competitor symbol.

FIG. 11C is a flowchart of an example method 1130 of chunk processing performed in connection with the SOV equalization/decoding. Method 1120 includes operations described above that expand on the operations of method 1100.

At 1132, receiver 104 divides the symbols/symbol samples produced by ADC 124 into overlapping chunks of the symbol samples. The overlapping chunks each includes leading overlap symbol samples (e.g., overlap-left samples 706) from a previous one of the overlapping chunks and that were previously processed, middle symbol samples from a current chunk (e.g., from current chunk 704) that were not previously processed, and trailing overlap symbol samples (e.g., overlap-right samples 710) that were not previously processed and that are to be used as leading overlap symbol samples for a next one of the overlapping chunks.

At 1134, receiver 104 processes each the overlapping chunks in sequence, or in parallel, as described in next operations 1136-1140.

At 1136, receiver 104 defines a window of the symbol samples (e.g., soft-value window W) within a particular overlapping chunk.

At 1138, receiver 104 incrementally slides a position of the window across the particular overlapping chunk, from the leading overlap symbol samples to the trailing overlap symbol samples.

At 1140, receiver 104 processes the window of the symbol samples at each position, to perform soft-value updates for LSBs of symbols processed in the window.

Figure 12:
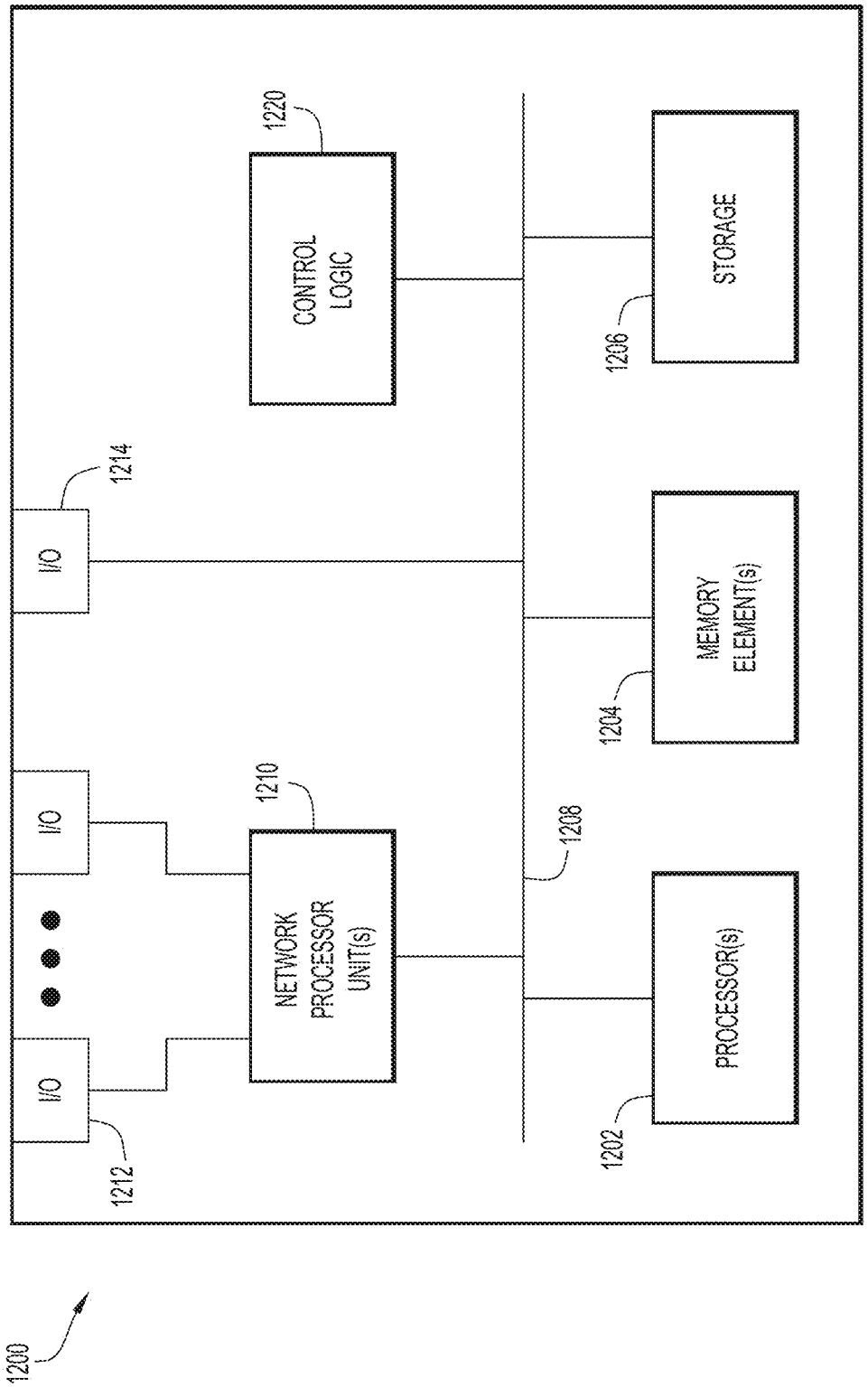
FIG. 12 is a hardware block diagram of a computing device that may perform functions associated with operations described herein in connection with the techniques depicted in FIGS. 1-11C.

Referring to FIG. 12, FIG. 12 illustrates a hardware block diagram of a computing device 1200 that may perform functions associated with operations discussed herein in connection with the techniques depicted in FIGS. 1-11C. In various embodiments, a computing device or apparatus, such as computing device 1200 or any combination of computing devices 1200, may be configured as any entity/entities as discussed for the techniques depicted in connection with FIGS. 1-11C in order to perform operations of the various techniques discussed herein. For example, computing device 1200 may be incorporated into transmitter 102 and receiver 104 to implement their respective operations described above.

In at least one embodiment, the computing device 1200 may be any apparatus that may include one or more processor(s) 1202, one or more memory element(s) 1204, storage 1206, a bus 1208, one or more network processor unit(s) 1210 interconnected with one or more network input/output (I/O) interface(s) 1212, one or more I/O interface(s) 1214, and control logic 1220. In various embodiments, instructions associated with logic for computing device 1200 can overlap in any manner and are not limited to the specific allocation of instructions and/or operations described herein.

In at least one embodiment, processor(s) 1202 is/are at least one hardware processor configured to execute various tasks, operations and/or functions for computing device 1200 as described herein according to software and/or instructions configured for computing device 1200. Processor(s) 1202 (e.g., a hardware processor) can execute any type of instructions associated with data to achieve the operations detailed herein. In one example, processor(s) 1202 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 1204 and/or storage 1206 is/are configured to store data, information, software, and/or instructions associated with computing device 1200, and/or logic configured for memory element(s) 1204 and/or storage 1206. For example, any logic described herein (e.g., control logic 1220) can, in various embodiments, be stored for computing device 1200 using any combination of memory element(s) 1204 and/or storage 1206. Note that in some embodiments, storage 1206 can be consolidated with memory element(s) 1204 (or vice versa), or can overlap/exist in any other suitable manner.

In at least one embodiment, bus 1208 can be configured as an interface that enables one or more elements of computing device 1200 to communicate in order to exchange information and/or data. Bus 1208 can be implemented with any architecture designed for passing control, data and/or information between processors, memory elements/storage, peripheral devices, and/or any other hardware and/or software components that may be configured for computing device 1200. In at least one embodiment, bus 1208 may be implemented as a fast kernel-hosted interconnect, potentially using shared memory between processes (e.g., logic), which can enable efficient communication paths between the processes.

In various embodiments, network processor unit(s) 1210 may enable communication between computing device 1200 and other systems, entities, etc., via network I/O interface(s) 1212 (wired and/or wireless) to facilitate operations discussed for various embodiments described herein. In various embodiments, network processor unit(s) 1210 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 1200 and other systems, entities, etc. to facilitate operations for various embodiments described herein. In various embodiments, network I/O interface(s) 1212 can be configured as one or more Ethernet port(s), Fibre Channel ports, any other I/O port(s), and/or antenna(s)/antenna array(s) now known or hereafter developed. Thus, the network processor unit(s) 1210 and/or network I/O interface(s) 1212 may include suitable interfaces for receiving, transmitting, and/or otherwise communicating data and/or information in a network environment.

I/O interface(s) 1214 allow for input and output of data and/or information with other entities that may be connected to computer device 1200. For example, I/O interface(s) 1214 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 1220 can include instructions that, when executed, cause processor(s) 1202 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof, and/or the like to facilitate various operations for embodiments described herein.

The programs described herein (e.g., control logic 1220) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, any entity or apparatus as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 1204 and/or storage 1206 can store data, software, code, instructions (e.g., processor instructions), logic, parameters, combinations thereof, and/or the like used for operations described herein. This includes memory element(s) 1204 and/or storage 1206 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

VARIATIONS AND IMPLEMENTATIONS

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™, mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

In various example implementations, any entity or apparatus for various embodiments described herein can encompass network elements (which can include virtualized network elements, functions, etc.) such as, for example, network appliances, forwarders, routers, servers, switches, gateways, bridges, loadbalancers, firewalls, processors, modules, radio receivers/transmitters, or any other suitable device, component, element, or object operable to exchange information that facilitates or otherwise helps to facilitate various operations in a network environment as described for various embodiments herein. Note that with the examples provided herein, interaction may be described in terms of one, two, three, or four entities. However, this has been done for purposes of clarity, simplicity and example only. The examples provided should not limit the scope or inhibit the broad teachings of systems, networks, etc. described herein as potentially applied to a myriad of other architectures.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

In summary, in one aspect, a method is provided comprising: receiving, from a communication channel, non-binary multilevel symbols that correspondingly represent multibit labels each including at least a least-significant bit (LSB) and a most-significant bit (MSB), the non-binary multilevel symbols mapped to the multibit labels according to set-partition labeling, which partitions the non-binary multilevel symbols between a first set and a second set according to a first value and a second value of the LSB, respectively; digitizing the non-binary multilevel symbols to produce symbol samples; and performing Soft-Output-Viterbi (SOV) equalization of the non-binary multilevel symbols based on the symbol samples, to produce decoded symbol information corresponding to the non-binary multilevel symbols.

In another aspect, an apparatus/receiver is provided comprising: a front-end (which may include a network I/O interface) to receive non-binary multilevel symbols that correspondingly represent multibit labels each including at least a least-significant bit (LSB) and a most-significant bit (MSB), the non-binary multilevel symbols mapped to the multibit labels according to set-partition labeling, which partitions the non-binary multilevel symbols between a first set and a second set according to a first value and a second value of the LSB, respectively; an analog-to-digital converter configured to digitize the non-binary multilevel symbols to produce symbol samples; and a processor configured to perform Soft-Output-Viterbi (SOV) equalization of the non-binary multilevel symbols based on the symbol samples, to produce decoded symbol information corresponding to the non-binary multilevel symbols.

In a further aspect, a non-transitory computer readable medium encoded with instructions is provided. The instructions, when executed by a processor of a receiver configured to (i) receive, from a communication channel, non-binary multilevel symbols that correspondingly represent multibit labels each including at least a least-significant bit (LSB) and a most-significant bit (MSB), the non-binary multilevel symbols mapped to the multibit labels according to set-partition labeling, which partitions the non-binary multilevel symbols between a first set and a second set according to a first value and a second value of the LSB, respectively, and (ii) digitize the non-binary multilevel symbols to produce symbol samples, cause the processor to perform: performing Soft-Output-Viterbi (SOV) equalization of the non-binary multilevel symbols based on the symbol samples, to produce decoded symbol information corresponding to the non-binary multilevel symbols.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:

1. A method comprising:
   receiving, from a communication channel, non-binary multilevel symbols that correspondingly represent multibit labels each including at least a least-significant bit (LSB) and a most-significant bit (MSB), the non-binary multilevel symbols mapped to the multibit labels according to set-partition labeling, which partitions the non-binary multilevel symbols between a first set and a second set according to a first value and a second value of the LSB, respectively;
   digitizing the non-binary multilevel symbols to produce symbol samples; and
   performing Soft-Output-Viterbi (SOV) equalization of the non-binary multilevel symbols based on the symbol samples, to produce decoded symbol information corresponding to the non-binary multilevel symbols.

2. The method of claim 1, wherein performing SOV equalization produces, as the decoded symbol information, a soft-value LSB and a hard-decision MSB that is representative of a corresponding multibit label for each of the non-binary multilevel symbols.

3. The method of claim 2, wherein performing SOV equalization further produces a conditional bit-flip indication for the hard-decision MSB to indicate that the hard-decision MSB is to be flipped when the soft-value LSB is determined to be incorrect.

4. The method of claim 1, wherein performing SOV equalization includes, for each of the non-binary multilevel symbols:
   in a multilevel trellis of possible outcomes, determining (i) a maximum likelihood (ML) path associated with an ML symbol that represents an ML multibit label, and (ii) competitor paths associated with competitor symbols that represent competitor multibit labels;
   determining, among the competitor symbols, flipped-bit competitor symbols having LSBs that are flipped with respect to an LSB of the ML symbol; and
   performing trace-back processing only on the competitor paths associated with the flipped-bit competitor symbols, to update soft values for the LSBs that are flipped.

5. The method of claim 4, wherein:
   performing trace-back processing only updates the soft values for the LSBs that are flipped, but does not update soft values for MSBs of the flipped-bit competitor symbols.

6. The method of claim 4, wherein MSBs of the flipped-bit competitor symbols are hard-decisions.

7. The method of claim 4, wherein determining the flipped-bit competitor symbols includes performing a bit-wise Exclusive OR (XOR) operation between the ML symbol and each of the competitor symbols.

8. The method of claim 4, wherein determining the ML path and the competitor paths includes traversing branches that connect sequential states of the multilevel trellis and, while traversing the branches:
- computing, for the branches, branch metrics and state metrics for the sequential states; and
- determining the ML path and the competitor paths based on the branch metrics and the state metrics.

9. The method of claim 1, wherein performing SOV equalization includes:
- dividing the symbol samples into overlapping chunks of the symbol samples, wherein the overlapping chunks each includes leading overlap symbol samples from a previous one of the overlapping chunks and that were previously processed, middle symbol samples that were not previously processed, and trailing overlap symbol samples that were not previously processed and are to be used as leading overlap symbol samples for a next one of the overlapping chunks; and
- processing the overlapping chunks in sequence.

10. The method of claim 9, wherein processing the overlapping chunks includes processing a particular overlapping chunk among the overlapping chunks by:
- defining a window of the symbol samples within the particular overlapping chunk;
- incrementally sliding a position of the window across the particular overlapping chunk, from the leading overlap symbol samples to the trailing overlap symbol samples; and
- processing the window of the symbol samples at each position.

11. The method of claim 1, wherein the non-binary multilevel symbols include multilevel pulse amplitude modulation (PAM) amplitudes.

12. An apparatus comprising:
- a front-end to receive non-binary multilevel symbols that correspondingly represent multibit labels each including at least a least-significant bit (LSB) and a most-significant bit (MSB), the non-binary multilevel symbols mapped to the multibit labels according to set-partition labeling, which partitions the non-binary multilevel symbols between a first set and a second set according to a first value and a second value of the LSB, respectively;
- an analog-to-digital converter configured to digitize the non-binary multilevel symbols to produce symbol samples; and
- a processor configured to perform Soft-Output-Viterbi (SOV) equalization of the non-binary multilevel symbols based on the symbol samples, to produce decoded symbol information corresponding to the non-binary multilevel symbols.

13. The apparatus of claim 12, wherein the decoded symbol information includes a soft-value LSB and a hard-decision MSB that represent a corresponding multibit label for each of the non-binary multilevel symbols.

14. The apparatus of claim 13, wherein the decoded symbol information further includes a conditional bit-flip indication for the hard-decision MSB to indicate that the hard-decision MSB is to be flipped when the soft-value LSB is determined to be incorrect.

15. The apparatus of claim 14, wherein the processor is configured to perform the SOV equalization by, for each of the non-binary multilevel symbols:
- in a multilevel trellis of possible outcomes, determining (i) a maximum likelihood (ML) path associated with an ML symbol that represents an ML multibit label, and (ii) competitor paths associated with competitor symbols that represent competitor multibit labels;
- determining, among the competitor symbols, flipped-bit competitor symbols having LSBs that are flipped with respect to an LSB of the ML symbol; and
- performing trace-back processing only on the competitor paths associated with the flipped-bit competitor symbols, to update soft values for the LSBs that are flipped.

16. The apparatus of claim 12, wherein the non-binary multilevel symbols include multilevel pulse amplitude modulation (PAM) amplitudes.

17. A non-transitory computer readable medium encoded with instructions that, when executed by a processor of a receiver configured to (i) receive, from a communication channel, non-binary multilevel symbols that correspondingly represent multibit labels each including at least a least-significant bit (LSB) and a most-significant bit (MSB), the non-binary multilevel symbols mapped to the multibit labels according to set-partition labeling, which partitions the non-binary multilevel symbols between a first set and a second set according to a first value and a second value of the LSB, respectively, and (ii) digitize the non-binary multilevel symbols to produce symbol samples, cause the processor to perform:
- performing Soft-Output-Viterbi (SOV) equalization of the non-binary multilevel symbols based on the symbol samples, to produce decoded symbol information corresponding to the non-binary multilevel symbols.

18. The non-transitory computer readable medium of claim 17, wherein the decoded symbol information includes a soft-value LSB and a hard-decision MSB that represent a corresponding multibit label for each of the non-binary multilevel symbols.

19. The non-transitory computer readable medium of claim 18, wherein the decoded symbol information further includes a conditional bit-flip indication for the hard-decision MSB to indicate that the hard-decision MSB is to be flipped when the soft-value LSB is determined to be incorrect.

20. The non-transitory computer readable medium of claim 17, wherein the instructions to cause the processor to perform performing SOV equalization include instructions to cause the processor to perform, for each of the non-binary multilevel symbols:
- in a multilevel trellis of possible outcomes, determining (i) a maximum likelihood (ML) path associated with an ML symbol that represents an ML multibit label, and (ii) competitor paths associated with competitor symbols that represent competitor multibit labels;
- determining, among the competitor symbols, flipped-bit competitor symbols having LSBs that are flipped with respect to an LSB of the ML symbol; and
- performing trace-back processing only on the competitor paths associated with the flipped-bit competitor symbols, to update soft values for the LSBs that are flipped.

* * * * *